United States Patent
Krümmer et al.

(10) Patent No.: US 11,444,616 B2
(45) Date of Patent: Sep. 13, 2022

(54) ADAPTIVE SWITCH SPEED CONTROL OF POWER SEMICONDUCTORS

(71) Applicant: SIEMENS AKTIENGESELLSCHAFT, Munich (DE)

(72) Inventors: Bastian Krümmer, Bad Staffelstein (DE); Andreas Kunert, Oberasbach (DE); Norbert Stadter, Buttenheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/609,245

(22) PCT Filed: Mar. 24, 2020

(86) PCT No.: PCT/EP2020/058090
§ 371 (c)(1),
(2) Date: Nov. 5, 2021

(87) PCT Pub. No.: WO2020/224857
PCT Pub. Date: Nov. 12, 2020

(65) Prior Publication Data
US 2022/0209767 A1    Jun. 30, 2022

(30) Foreign Application Priority Data
May 7, 2019 (EP) .................... 19172967

(51) Int. Cl.
*H03K 17/16* (2006.01)
*H03K 17/04* (2006.01)
(52) U.S. Cl.
CPC ............. *H03K 17/16* (2013.01); *H03K 17/04* (2013.01)

(58) Field of Classification Search
CPC .... H03K 17/16; H03K 17/161; H03K 17/162; H03K 17/00; H03K 17/04; H03K 17/041;
(Continued)

(56) References Cited

U.S. PATENT DOCUMENTS 4,540,893 A    9/1985 Bloomer
6,137,329 A    10/2000 Kardash
(Continued)

FOREIGN PATENT DOCUMENTS

DE    34 20 008 A1    12/1984
DE    102 11 075 A1    10/2003
(Continued)

OTHER PUBLICATIONS

Park Shihong et al: "Flexible dv/dt and dI/dt control method for insulated gate power switches", Conference Record of the 2001 IEEE Industry Applications Conference. 36th IAS Annual Meeting . Chicago, IL, Sep. 30-Oct. 4, 2001; [Conference Record of the IEEE Industry Applications Conference. IAS Annual Meeting], New York, NY: IEEE, US, pp. 1038, XP032142858, DOI: 10.1109/ IAS.2001.955592; ISBN: 978-0-7803-7114-9, the whole document; 2001.
(Continued)

*Primary Examiner* — Hai L Nguyen
(74) *Attorney, Agent, or Firm* — Henry M. Feiereisen LLC

(57) ABSTRACT

A semiconductor switch device includes a switchable power semiconductor and a control circuit. The semiconductor switch device has a current sink and a current amplifier designed to amplify during a switching process a partial current of the total current flowing across the control capacitor that is not discharged by the current sink up to an adjustable maximum current and to apply the amplified partial current to the control electrode of the power semi-
(Continued)

conductor so as to counteract the change in the voltage across the collector-emitter path or the drain-source path of the power semiconductor during the switching process. An additional circuit provides an adapted switch-on transition by smoothing the collector voltage and/or the drain voltage of the switchable power semiconductor when switching over the collector-emitter path or the drain-source path of the power semiconductor from a blocked state into a conductive state.

8 Claims, 8 Drawing Sheets

(58) Field of Classification Search
CPC ....... H03K 17/04106; H03K 17/04113; H03K 17/06; H03K 17/063; H03K 17/081; H03K 17/08104; H03K 17/08112
See application file for complete search history.

(56) References Cited

U.S. PATENT DOCUMENTS

| | | | | |
|---|---|---|---|---|
| 7,046,051 | B2* | 5/2006 | Melbert | H03K 17/166 327/110 |
| 8,633,736 | B2* | 1/2014 | Illegems | H03K 17/08104 327/108 |
| 9,209,787 | B2* | 12/2015 | Shelton | H03K 17/18 |
| 2003/0174081 | A1 | 9/2003 | Bruckmann et al. | |
| 2004/0085117 | A1 | 5/2004 | Melbert et al. | |
| 2011/0291707 | A1 | 12/2011 | Illegems | |
| 2014/0375362 | A1 | 12/2014 | Lobsiger et al. | |
| 2017/0104338 | A1 | 4/2017 | Hopperdietzel | |
| 2020/0067500 | A1 | 2/2020 | Norling et al. | |

FOREIGN PATENT DOCUMENTS

| | | |
|---|---|---|
| DE | 10 2005 012 151 B3 | 6/2006 |
| DE | 10 2014 214 260 A1 | 10/2015 |
| DE | 10 2018 007 011 A1 | 3/2019 |
| EP | 2 816 728 A1 | 12/2014 |
| WO | WO 2002-047265 A2 | 6/2002 |
| WO | WO 2011-149632 A2 | 12/2011 |

OTHER PUBLICATIONS

PCT International Search Report and Written Opinion of International Searching Authority dated Jul. 21, 2020 corresponding to PCT International Application No. PCT/EP2020/058090 filed Mar. 24, 2020.

* cited by examiner

ADAPTIVE SWITCH SPEED CONTROL OF POWER SEMICONDUCTORS

CROSS-REFERENCES TO RELATED APPLICATIONS

This application is the U.S. National Stage of International Application No. PCT/EP2020/058090, filed Mar. 24, 2020, which designated the United States and has been published as International Publication No. WO 2020/224857 A1 and which claims the priority of European Patent Application, Ser. No. 19172967.2, filed May 7, 2019, pursuant to 35 U.S.C. 119(a)-(d).

BACKGROUND OF THE INVENTION

The invention relates to a semiconductor switch apparatus comprising a switchable power semiconductor and an adaptive switch speed control for controlling the switching speed of the power semiconductor.

Such semiconductor switch apparatuses are used, for example, in frequency converters, which are used in drive engineering, wherein the switchable power semiconductor is configured as a bipolar transistor with an insulated-gate electrode (IGBT). However, the invention relates to all types of switchable power semiconductors. This means power semiconductors which have a base or a gate, a collector and an emitter as well as switchable semiconductors which have a gate, a drain and a source terminal.

The switching speed of power semiconductors is typically selected according to two contrasting criteria. Firstly, for minimizing switching losses, assuming a safe operation of the power semiconductors, switching is to take place as quickly as possible. Secondly, in order to prevent electromagnetic emissions and to improve electromagnetic compatibility (EMC), the switching speed of the power semiconductor is to be limited.

The criterion of minimum switching losses and the criterion of minimum electromagnetic compatibility are mutually contradictory design aims and also cannot be implemented taking account of all the operating parameters to the same extent.

For example, at switch-on of a power semiconductor configured as an IGBT, the switching losses and the rate of rise of the voltage (change of the voltage change during the switching process) change contradirectionally with increasing breaking current.

On switching off such an IGBT, however, the rate of rise of the voltage and switching losses increase approximately unidirectionally with increasing breaking current.

Therefore, both due to the required taking account of further operating parameters, when the switching speed of a power semiconductor is specified, a compromise must always be found. Where the operating parameters are extended so that operation in the limit regions of the operating parameters is still possible, power and/or efficiency losses must be accepted with semiconductor switch apparatuses according to the prior art.

Document DE 102 11 075 A1 describes a controlled drive circuit for an analog controlled power semiconductor comprising a digitally operating logic component with a control input to which control signals are feedabie via an A/D converter, with which control signals the digital output signal of the logic component can be influenced, said output signal being switched to a component or a component assembly for converting this output signal into an analog or quasi-analog control variable for the power semiconductor.

Document DE 10 2005 012 151 B3 describes a method and a circuit arrangement for switch-on and switch-off control of power semiconductor switches with an upstream control stage and optimization of the switching speed for switching on and off, wherein the collector-emitter current of the power semiconductor switch is ascertained and the switching speed of the next subsequent switching-on process is controlled dependent upon this collector-emitter current. Arranged upstream of a control stage is a sample-and-hold circuit controlled by means of the control signal for the power semiconductor switch for storing the collector-emitter voltage of the power semiconductor switch and, in each case, one further control stage adjusting the control of the switching speed dependent upon the sample-and-hold signal for the switch-on and switch-off of the power semiconductor switch.

Further methods known from the prior art for improving electromagnetic compatibility (EMC) are EMC filters and shields. Also known are methods for dissipation of losses, for example, improved cooling or a greater power semiconductor effort.

It is an object of the invention to provide an improved semiconductor switch apparatus and an improved frequency converter.

SUMMARY OF THE INVENTION

The object is achieved according to the invention, with regard to the improved semiconductor switch apparatus, by a semiconductor switch apparatus as set forth hereinafter. The object is achieved, with regard to the improved frequency converter, by a frequency converter as set forth hereinafter.

Advantageous embodiments of the invention are the subject matter of the subclaims.

A semiconductor switch apparatus comprises a power semiconductor which is switchable via a control electrode, in the case of an IGBT also known as the gate electrode, along its collector-emitter path, having a collector, an emitter and a gate as well as at least one control circuit which is connected via a regulating capacitor to the at least one control circuit. The invention is also transferrable to other switchable power semiconductors such as, for example, MOSFETs which, in place of a collector and an emitter, have a drain and a source. The terms collector and drain, as well as emitter and source are therefore to be regarded as synonyms. For the sake of clarity, for control electrode, the expression gate electrode is also used below. Furthermore, it will not be pointed out explicitly at every point that the collector and the emitter always also refer to the drain and the source.

A control circuit comprises a current sink and a current amplifier in each case. The current sink is capacitively coupled via a regulating capacitor to the collector of the power semiconductor and is configured for diverting a first partial current of the capacitor current flowing during a switching process via the regulating capacitor up to a settable maximum current to ground. The current sink is connected to an adjustable voltage source and is adjusted so that the maximum current drawable and divertable to ground is adjustable by means of the adjustable voltage source.

The current amplifier is connected on the input side to the end of the current sink that is capacitively coupled to the regulating capacitor, and is fed with a positive or a negative supply voltage. On the output side, the power amplifier is connected to the gate electrode of the power semiconductor.

The current amplifier is configured such that a second partial current corresponding to the residual current of the capacitor current flowing during a switching process via the regulating capacitor which is not diverted by the current sink, is acquired on the input side and amplified by a predetermined amplification factor and is fed into the gate electrode of the power semiconductor such that the change in the voltage is counteracted via the collector-emitter path of the power semiconductor during a switching process.

By means of the adjustable voltage source, the gradient of the voltage change of the collector-emitter voltage during a switching process can thus be controlled at the power semiconductor in that with a high voltage of the adjustable voltage source, a low residual current of the capacitor current is amplified and is fed into the gate electrode of the power semiconductor and correspondingly with a low voltage of the adjustable voltage source, a high residual current of the capacitor current is amplified and is fed into the gate electrode of the power semiconductor.

In an advantageous manner, therefore, at each operating point of the power semiconductor, a switching speed can be set that is optimal in relation to the operating parameters and/or the power loss during the switching process and/or the electromagnetic compatibility. Thus, critical operating points, for example, the interruption of a freewheeling diode during its switch-off, the switching overvoltage during switch-off of the power semiconductor or the start of the power component at low temperatures are better overcome than with apparatuses and methods of the prior art.

The phenomena occurring in limit operation, for example, in very low or very high collector-emitter current of the power semiconductor, for example, a high rate of rise of the voltage or high switching losses, become less critical as a result of the solution according to the invention.

The performance of the power component is improved since now a higher degree of freedom is provided for the design criteria with regard to the switching speed. Thereby, switching losses are lessened and/or the electromagnetic compatibility is improved. By this means, costs can be reduced in relation to EMC, semiconductor and cooling expenditure.

The switching speed can be restricted to a maximum for applications which place restrictions with regard to rates of rise of the voltage at the power component output. Herein, for example, a filter for the rate of rise of the voltage can be dispensed with. Hardware-equivalent power components can be made fit for different applications by adjustment in the software and can thus be dispensed with. By this means, the multiplicity of variants is reduced.

As compared with an adaptive switch speed control in which the switching speed is varied by means of gate resistors, constant current or voltage ramp, the invention offers the advantage that the switching timepoints are hardly changed during adaptation. Thus, the switching delay times remain approximately constant since intervention takes place only after the occurrence of the rate of rise of the voltage in the switching process, so that only the adapted rate of rise of the voltage itself has an influence on the completed switching process.

As a result, this solution has hardly any negative influence on the behavior of the controller of a higher-order control system since the voltage to be output is hardly changed by means of additional delay time.

In addition, the locking time (i.e. the dead time between the lower and the upper power semiconductors of a half-bridge) can be specified without taking account of a variable delay time, so that this locking time becomes smaller and a semiconductor switch apparatus according to the invention is also suitable for higher switching frequencies since the voltage loss due to the dead tune is reduced.

The costs, space requirement and complexity of this invention are significantly reduced as compared with a purely digital solution. Furthermore, due to the small component cost, a smaller failure likelihood can also be expected.

The circuit of the invention also has a good dynamic response for regulating rapid switching processes. The simultaneous engagement of the at least one control circuit according to the invention directly on the gate of the power semiconductor during the control of the switching process by a driver signal independent thereof offers the advantage that this engagement has low resistance in both directions.

For example, the control electrode, in particular, the gate electrode of the power semiconductor is pulled in the direction of the negative supply voltage during switch-off via the switch-off resistor, whereas the at least one control circuit according to the invention simultaneously pulls in the direction of the positive supply voltage. By this means, a high amplification and a sufficient dynamic response is achieved in order to control the rate of rise of the voltage.

The semiconductor switch apparatus herein comprises an additional circuit for an adapted switch-on transition which is connected to the gate electrode of the power semiconductor and which is configured for a smooth transition of the collector voltage of the power semiconductor on switching over of its collector-emitter path from a blocked to a conductive state.

Thereby, the rate of rise of the voltage of the collector-emitter voltage of the power semiconductor which can be increased on the basis of the reaction time of the at least one control circuit and/or through the gate leakage inductance of the power semiconductor during switch-on can be limited to a desired low value.

In one embodiment of the invention, the semiconductor circuit comprises a first control circuit with a first current amplifier and a second control circuit with a second current amplifier, wherein the first current amplifier is connected to the negative supply voltage and is configured for feeding a negative current into the gate electrode of the power semiconductor and the second power amplifier is connected to the positive supply voltage and is configured for feeding a positive current into the gate electrode of the power semiconductor.

An advantage of this embodiment lies therein that the rate of rise of the voltage is adjustable independently both for switch-on processes and also for switch-off processes by means of separately adjustable voltage sources.

In one embodiment, a current sink comprises a metal oxide semiconductor field effect transistor (MOSFET) connected in a current feedback arrangement, a current feedback resistor and an adjustable voltage source, wherein the drain electrode of the MOSFET is connected to the regulating capacitor and the source electrode of the MOSFET is connected via the current feedback resistor to ground and the gate electrode of the MOSFET is fed by the adjustable voltage source referenced against ground.

Such current sinks are easily and economically produced with available components.

In one embodiment, a current amplifier comprises a MOSFET connected as a source follower, a gate resistor, a source resistor and a diode, wherein the diode is arranged in the forward conducting direction facing toward the gate electrode of the MOSFET between the regulating capacitor and the gate electrode of the MOSFET. The gate resistor is arranged between the gate electrode of the MOSFET and the gate electrode of the power semiconductor. The source resistor is arranged between the source electrode of the MOSFET and the gate electrode of the power semiconductor.

In order to bring together in general the source follower circuit and the emitter follower as a higher-level expression, it is designated the source/emitter follower.

Such current amplifiers are easily and economically producible with available components.

In one embodiment, in place of a bipolar transistor connected as a source follower, a current amplifier has a bipolar transistor connected as an emitter follower, wherein in each case, the gate electrode of the MOSFET is replaced by the base electrode or the gate electrode of the bipolar transistor, the drain electrode of the MOSFET is replaced by the collector electrode of the bipolar transistor and the source electrode of the MOSFET is replaced by the emitter electrode of the bipolar transistor.

A bipolar transistor has a good forward conduction behavior as compared with a MOSFET, a high reverse voltage and a high level of robustness.

In some embodiments of the invention, the power semiconductor is configured as a bipolar transistor with an insulated gate electrode (IGBT), as a metal oxide semiconductor field-effect transistor (MOSFET), as a silicon carbide metal oxide semiconductor field-effect transistor (SiC MOSFET) or as a bipolar transistor. Such power semiconductors are available economically and are easily integrated into a semiconductor switch apparatus.

A frequency converter comprises a semiconductor switch apparatus in one of the embodiments described, wherein the power semiconductor is configured as an IGBT. Such frequency converters are suitable for uses in drive engineering and have low switching losses and a good electromagnetic compatibility.

BRIEF DESCRIPTION OF THE DRAWING

The above-described properties, features and advantages of this invention and the manner hi which these are achieved will now be described more clearly and intelligibly in relation to exemplary embodiments, and illustrated hi detail by reference to the drawings. In the drawings.

DETAILED DESCRIPTION OF PREFERRED EMBODIMENTS

Figure 2:
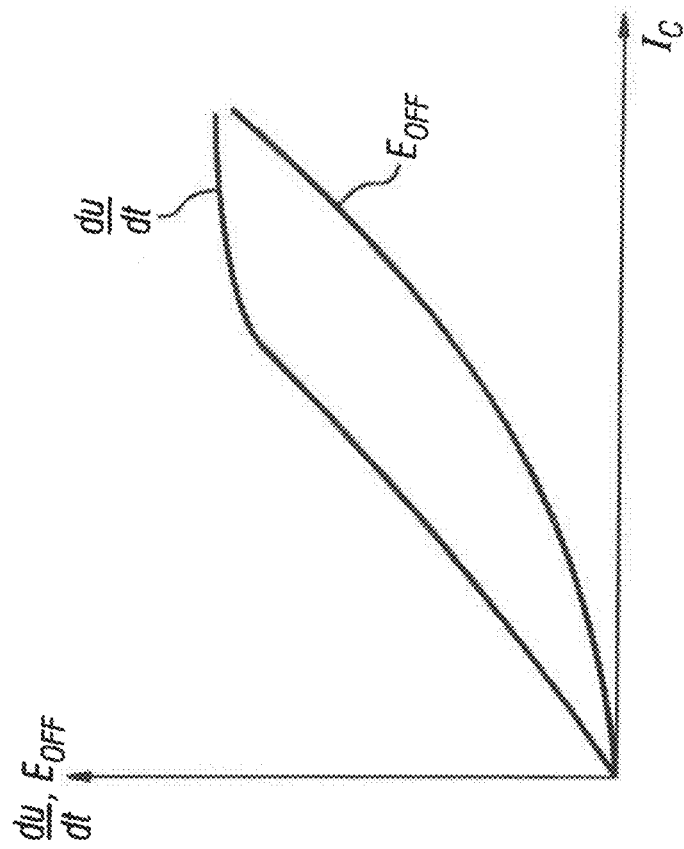

Parts which correspond to one another are provided with the same reference characters in all the drawings.

Figure 1:
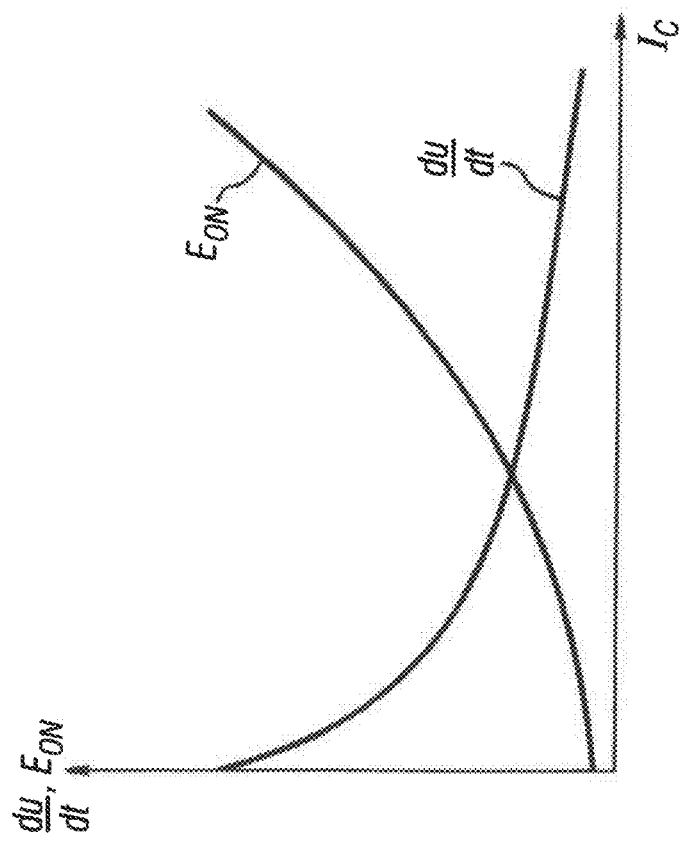
FIG. 1 schematically shows the dependence of switching energy and the rate of rise of the voltage on the collector current at switch-on of a power semiconductor, FIG. 2 schematically shows the relationship between switching energy and the rate of rise of the voltage at switch-off of a power semiconductor, FIG. 3 schematically shows a circuit for controlling the rate of rise of the voltage at switch-on, FIG. 4 schematically shows a circuit for controlling the rate of rise of the voltage at switch-off, FIG. 5 schematically shows an embodiment of a current sink, FIG. 6 schematically shows an embodiment of a current amplifier, FIG. 7 schematically shows a simulation circuit.

FIG. 1 schematically shows the dependence of the rate of rise of the voltage $$\frac{du_{CE}}{dt}$$

and the switch-on energy $E_{ON}$ of a power semiconductor which can be configured, for example, as a bipolar transistor with an insulated gate electrode (IGBT), on the strength of the collector current $I_C$. At switch-on, the rate of rise of the voltage $$\frac{du_{CE}}{dt}$$

and the switch-on energy $E_{ON}$ change contradirectionally dependent upon the switched collector current $I_C$. As the collector current $I_C$ increases, the switch-on energy $E_{ON}$ increases while the rate of rise of the voltage $$\frac{du_{CE}}{dt}$$

decreases.

As shown in FIG. 2, however, at switch-off the rate of rise of the voltage $$\frac{du_{CE}}{dt}$$

and the switch-off energy $E_{OFF}$ change codirectionally: both values increase with increasing switched collector current $I_C$.

Apart from the collector current $I_C$, the switching energies $E_{ON}$, $E_{OFF}$ and the rate of rise of the voltage $$\frac{du_{CE}}{dt}$$

are aiso dependent upon further parameters, for example, on the temperature and the intermediate circuit voltage. Thus, for example, a power semiconductor will switch faster at a low temperature and a high intermediate circuit voltage than at a high temperature and low intermediate circuit voltage.

Figure 3:
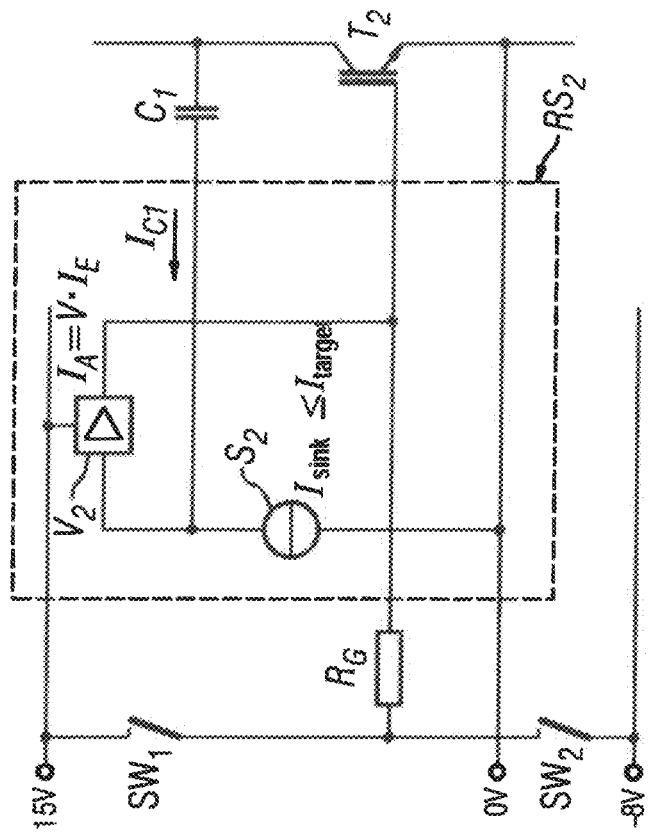

FIG. 3 schematically shows a first control circuit RS1 for controlling the gradient of a collector voltage $$\frac{du}{dt}$$

at switch-on of a switching transistor $T_2$ which is configured as an IGBT, by means of a first current sink $S_1$ and a first current amplifier $V_1$. The switching transistor $T_2$ is switched by means of a first and second switch SW1, SW2 via a switching transistor gate resistor $R_G$. The two switches SW1, SW2 switch alternatingly and are thus at least never closed simultaneously.

According to the invention, the collector of the switching transistor $T_2$ is capacitively coupled to the first current sink $S_1$ via a regulating capacitor $C_1$. The first current sink $S_1$ is configured so that it absorbs a current from the regulating capacitor $C_1$ up to a current threshold $I \leq I_{target}$ and conducts it away to 0V. The first current sink $S_1$ does not absorb the current $\max(I_{C1}-I_{target},0)$ above the current threshold $I_{target}$ fed in by the regulating capacitor $C_1$. The current difference $\Delta I_{C1}=\max(I_{C1}-I_{target},0)$ not absorbed by the first current sink $S_1$ is fed to the first current amplifier $V_1$ and is thereby amplified by an amplification factor v. The amplified difference current $v \cdot \Delta I_{C1}$ is fed into the gate of the switching transistor $T_2$.

Figure 4:
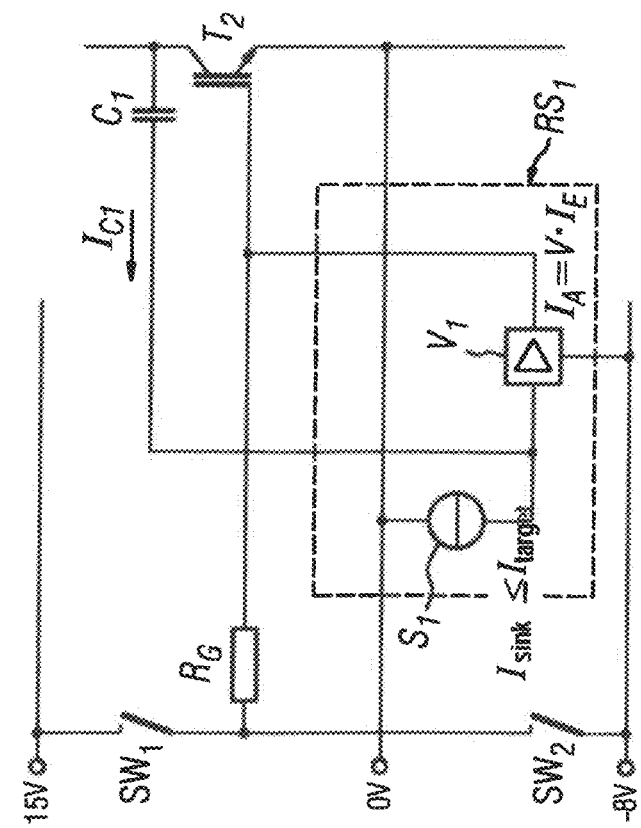

In a similar way, FIG. 4 schematically shows a circuit for controlling the rate of rise of the voltage $$\frac{du_{CE}}{dt}$$

at switch-off of the switching transistor $T_2$ by means of a second control circuit RS2 which is formed by a second current sink $S_2$ and a second current amplifier $V_2$.

The functioning of the two circuits according to FIG. 3 and FIG. 4 is equivalent in principle and will now be described by reference to the circuit of FIG. 4.

For this purpose, it is assumed that the switching transistor $T_2$ was switched on at the start of the switching process. If the first switch SW1 switches off and the second switch SW2 switches on, the gate of the switching transistor $T_2$ is discharged. The switching transistor $T_2$ switches off and the voltage u at the collector of the switching transistor $T_2$ rises. The regulating capacitor $C_1$ conducts the increased collector voltage away, wherein a regulating capacitor current $$I_{C1} = C_1 \cdot \frac{du}{dt}$$

flows via the regulating capacitor $C_1$.

The second current sink $S_2$ draws from this current via the regulating capacitor $C_1$ a partial current $I_{sink}$ of not more than $I_{target}$. The remaining portion of the current of $$\Delta I_{C1} = I_{C1} - I_{sink} = C_1 \cdot \frac{du}{dt} - I_{sink}$$

is fed into the second current amplifier $V_2$ and is amplified thereby by the amplification factor v. The output current of the second current amplifier $V_2$ therefore amounts to $I_A = v \cdot \Delta I_{C1}$.

This output current $I_A$ is fed to the gate of the switching transistor $T_2$. By this means, the gate voltage of the switching transistor $T_2$ is increased and thus the gradient of the collector current $I_C$ of the now less strongly blocked switching resistor $T_2$ is reduced. This causes a reduction in the rate of rise of the collector voltage $$\frac{du}{dt}$$

and thereby, a reduction in the regulating capacitor current $I_{C1}$ via the regulating capacitor $C_1$.

By this means, the rate of rise of the collector voltage of the switching transistor $T_2$ declines.

For a second current amplifier $V_2$ assumed to be functioning ideally with an amplification factor $v \to \infty$, a rate of rise of the voltage of $$\frac{du}{dt} = \frac{1}{C} \cdot I_{sink}$$

comes about.

Since the greatest partial current absorbable by the second current sink $S_2$ is limited according to $I_{sink} \leq I_{target}$, the current threshold $I_{target}$ acts as an adjustment variable for the rate of rise of the voltage $$\frac{du}{dt}.$$

If the rate of rise of the voltage on switching exceeds the limit value defined by the current threshold $I_{target}$, so that $$\frac{du}{dt} > \frac{1}{C_1} \cdot I_{target},$$

then the rate of rise of the voltage is controlled by the closed circuit from the collector of the switching transistor $T_2$ via the regulating capacitor $C_1$ and the second current amplifier $V_2$ to the gate of the switching transistor $T_2$ and via the transfer characteristic of the switching transistor $T_2$ back again to the collector thereof.

If the change in the collector voltage at switch-off does not reach the maximum value specified by means of the current threshold so that $$\frac{du}{dt} \leq \frac{1}{C_1} \cdot I_{target}$$

applies throughout the whole switch-off process, then the second control circuit RS2 formed by the second current sink $S_2$ and the second current amplifier $V_2$ has no effect.

Figure 5:
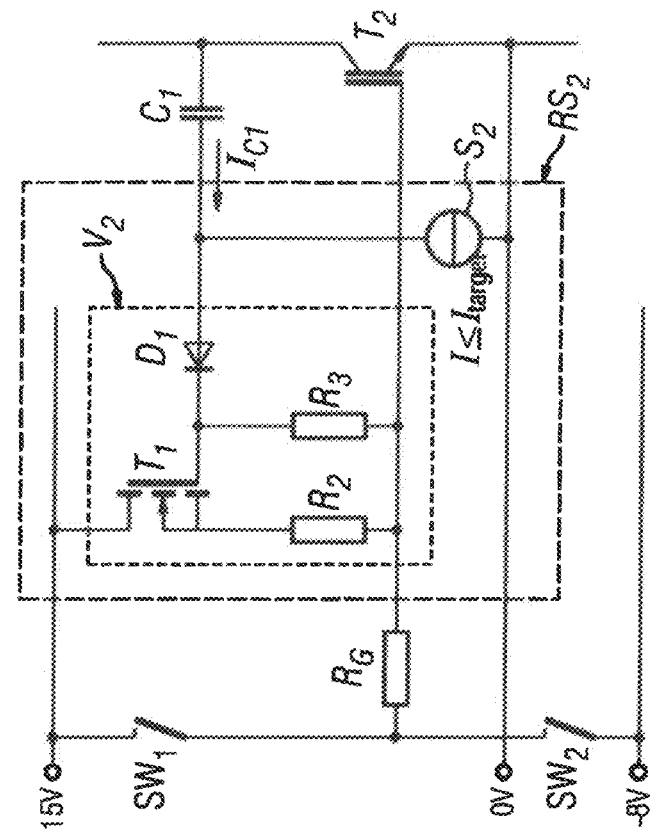

FIG. 5 schematically shows an embodiment for the second current sink $S_2$ of the second control circuit RS2 for limiting the rate of rise of the collector voltage $$\frac{du}{dt}$$

of the switching transistor $T_2$ at switch-off. The second current sink $S_2$ comprises a metal oxide semiconductor field-effect transistor (MOSFET) $T_3$, a current feedback resistor $R_1$ which is connected to ground on the source side of the MOSFET $T_3$, and an adjustable voltage source $U_{adapt}$ adapt which specifies the gate voltage of the MOSFET $T_3$. With a positive gate voltage of the adjustable voltage source $U_{adapt}$, the current threshold $I_{target}$ can be set, above which the MOSFET $T_3$ transfers into linear operation.

The current $I_{sink}$ absorbed by the second current sink $S_2$ can be calculated dependent upon the voltage of the adjustable voltage source $U_{adapt}$, dependent upon the gate-source threshold voltage $U_{GS(th),3}$ of the MOSFET $T_3$ and dependent upon the current feedback resistor $R_1$, as follows:

$$U_{GS(th),3} + I_{sink} \cdot R_1 = U_{adapt}$$

$$I_{sink} = \frac{U_{adapt} - U_{GS(th),3}}{R_1}$$

Figure 6:
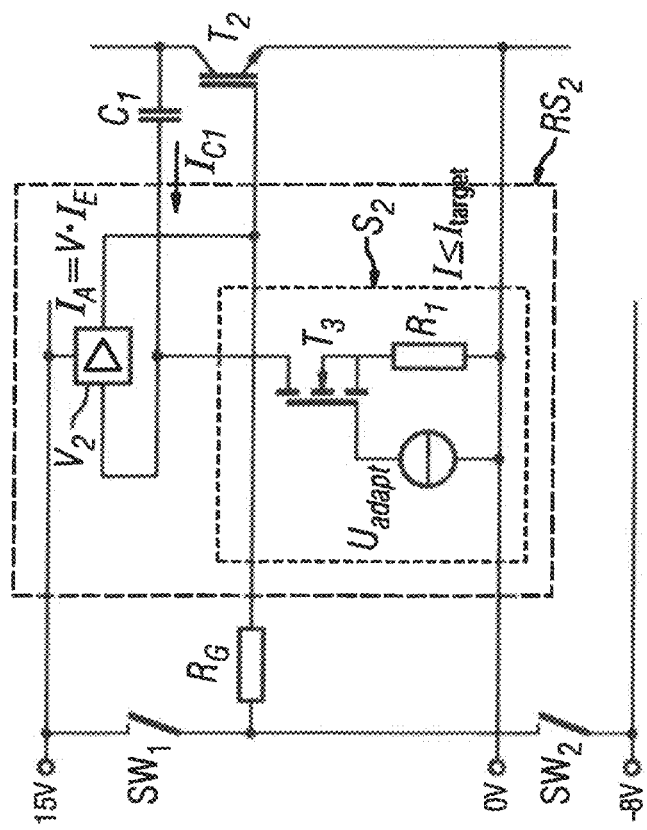

FIG. 6 schematically shows an embodiment for the second current amplifier $V_2$, which comprises a MOSFET $T_1$, a source resistor $R_2$, a gate resistor $R_3$ and a diode $D_1$. The MOSFET $T_1$, the source resistor $R_2$ and the gate resistor $R_3$ are connected in the manner of a source follower $V_2$. The diode $D_1$ connected upstream on the input side at the gate decides the current direction so that the source follower $V_2$ is effective only for a positive, i.e. flowing in the direction of the gate, difference current $\Delta I_{C1} = I_{C1} - I_{sink}$.

In an exemplary embodiment (not shown in detail), the MOSFET $T_1$ can be replaced by a bipolar transistor. Then the second current amplifier $V_2$ is operated as an emitter follower.

By means of the resistors $R_2$, $R_3$, taking account of the gate-source-threshold voltage $U_{GS(th),1}$ of the MOSFET $T_1$, the amplification factor v of the second current amplifier $V_2$ can be determined as follows:

$$v = \frac{R_3 - \frac{U_{GS(th),1}}{I_{C1} - I_{sink}}}{R_2}$$

For the operation of the switching transistor $T_2$ in the Miller plateau and ignoring the parasitic Miller capacitance between the gate electrode and the collector electrode, $$U_{GS(th),1} + I_{R_G} \cdot R_2 = (I_{C1} - I_{sink}) \cdot R_3$$

where $I_{RG}$ is the current flowing along the switching transistor gate resistor $R_G$ which results from the negative supply voltage $U_-$ which is assumed in FIG. 6, by way of example, to be minus 8 Volt, and from the Miller plateau voltage $U_{Millerplateau,2}$ of the switching transistor $T_2$, there results as follows:

$$I_{R_G} = \frac{(|U_-| + U_{Millerplateau,2})}{R_G}$$

Using the current-voltage relationship at the switching transistor $T_2$ $$I_{C1} = C_1 \cdot \frac{du}{dt} = I_{Senke} + \frac{U_{GS(th),1} + \frac{R_2}{R_G}(|U_-| + U_{Millerplateau,2})}{R_3}$$

and taking account of the relationship described by reference to FIG. 5 for the current $$I_{sink} = \frac{U_{adapt} - U_{GS(th),3}}{R_1},$$

therefore for the rise rate of the collector voltage of the switching transistor $T_2$, the following voltage rise rate determining equation results:

$$\frac{du}{dt} = \frac{1}{C_1} \cdot \left( \frac{U_{GS(th),1} + \frac{R_2}{R_G}(|U_-| + U_{Millerplateau,2})}{R_3} + \frac{U_{adapt} - U_{GS(th),3}}{R_1} \right)$$

As is apparent therefrom, the rate of rise of the voltage $$\frac{du}{dt}$$

can be controlled directly via the adjustable voltage source $U_{adapt}$.

In the use of this voltage rise rate determining equation, it is to be taken into account that for the gate-source threshold voltages $U_{GS(th),1}$, $U_{GS(th),3}$ and for the Miller plateau voltage $U_{Millerplateau,2}$ it is not the datasheet values that are to be used, but that these values are to be taken from the diagrams of the respective components for the respectively adjustable drain current and/or collector current $I_C$.

If the second current amplifier $V_2$ is configured, by means of a bipolar transistor in place of a MOSFET $T_1$, as an emitter follower, then in place of the gate-source threshold voltage $U_{GS(th),1}$, the base-emitter voltage $U_{BE}$ of the bipolar transistor must be inserted into the voltage rise rate determining equation.

The functioning of the first control circuit RS1 for the control of the rate of rise of the voltage during the switching-on process according to FIG. 3 is provided in a similar way to the description regarding the second control circuit RS2, wherein the components according to the circuit of FIG. 3 are to be used in place of the components according to the circuit of FIG. 4.

Figure 7:
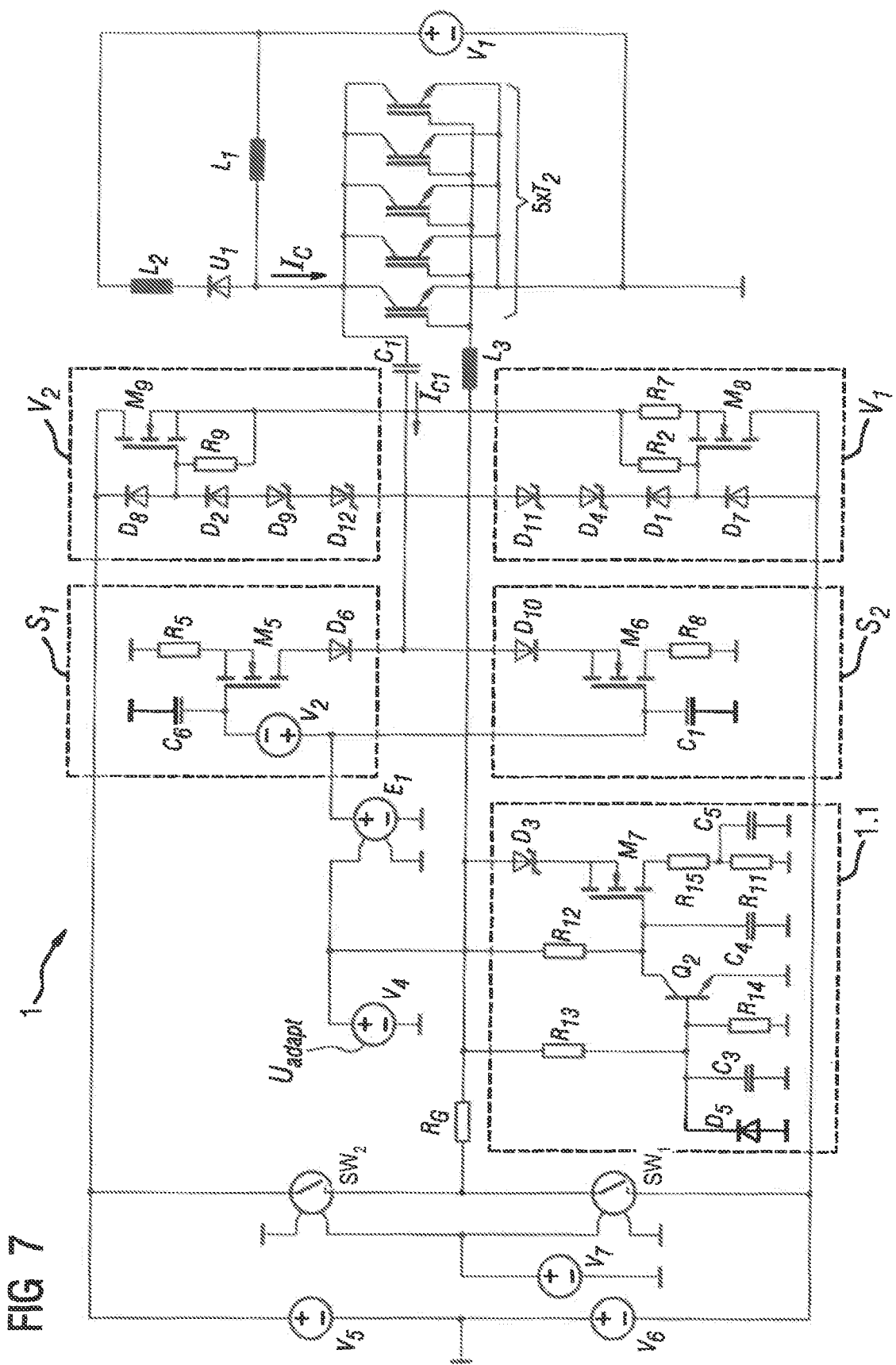

FIG. 7 shows a circuit for a simulation circuit 1 of the first and second control circuit RS1, RS2 simulated by means of the simulation tool LTSpice. The simulation circuit 1 comprises an additional circuit 1.1 for an adapted switch-on transition, said addition circuit being arranged on the gate side of the switching transistor $T_2$. In addition, the simulation circuit 1 has a first leakage inductance L2 on the cathode side of the freewheeling diode $U_1$ and a second leakage inductance L3 arranged on the gate side of the switching transistor $T_2$, in order to enable an application-related simulation of the switching behavior.

For the simulation of an IGBT nominal current of 200 ampere, the switching transistor $T_2$ is emulated by a parallel connection of five individual transistors which are simulated as a level-2 model of a 40 ampere IGBT3 trench-IGBT according to information from the manufacturer Infineon.

The simulation circuit 1 further comprises voltage controlled switches as the switches SW1, SW2 and is supplied with a bipolar driver supply with a positive supply voltage $U_+$=15 Volt and a negative supply voltage $U_-$=−8 Volt.

The additional circuit 1.1 for an adapted switch-on transition enables a sliding transition of the collector voltage u from the blocking to the conducting state and prevents or reduces a delay of the desired reduction in the rates of rise of the voltage $$\frac{du}{dt},$$

which otherwise would be caused due to the reaction time of the power amplifier V$_1$ and the leakage inductance L3 on sudden switch-on of the collector current I$_C$. In one embodiment in which the maintenance of a maximum rate of rise of the voltage $$\frac{du}{dt} \le \frac{du}{dt}\bigg|_{max\square}$$

is not required, the additional circuit 1.1 can be dispensed with. For the switch-off process, the additional circuit 1.1 is not required since the rate of rise of the voltage $$\frac{du}{dt}$$

slowly rises at switch-off and thus a sufficiently rapid control intervention of the current amplifier V$_2$ is possible.

In the embodiment according to FIG. 7, the first amplifier V$_2$ V$_1$ has a resistor R7. In an advantageous manner, this resistor R7 and the gate resistor R$_G$ of the driver offer a damping for the oscillator circuit that is formed from the gate capacitance of the switching transistor T$_2$ and the leakage inductance L3 of the gate circuit. In contrast to the good dynamic response of the circuit according to the invention, operational amplifier circuits known from the prior art lose switching time and can only deliver a low gate current. Drivers known from the prior art with a push-pull output stage also offer only a smaller dynamic response due to the hysteresis resulting from the principle involved. A switching output stage known from the prior art with an inductance in the gate circuit also offers only a reduced dynamic response as compared with the invention and is complex and expensive in the implementation.

FIGS. 8 to 11 show results of a simulation of the simulation circuit 1 with the simulation tool LTSpice, wherein changes in the collector voltage u, the switching current i switched by the switching transistor T$_2$ and in the gate voltage u$_G$ at the gate of the switching transistor T$_2$ as a function of time t measured from the switching time point. Each of FIGS. 8 to 11 shows collector voltage variations u$^{(k)}$(t),k=1 . . . 4, switching current variations i$^{(k)}$(t), k=1 . . . 4 and gate voltage variations u$_G^{(k)}$(t),k=1 . . . 4 for four different settings of the adjustable voltage source U$_{adapt}$, whereby the influence thereof on the rate of rise of the voltage $$\frac{du}{dt}$$

during the switching process is made clear. The index k increases, in each case, with the voltage value of the adjustable voltage source U$_{adapt}$, and thus also with the rate of rise of the voltage $$\frac{du}{dt}.$$

Figure 8:
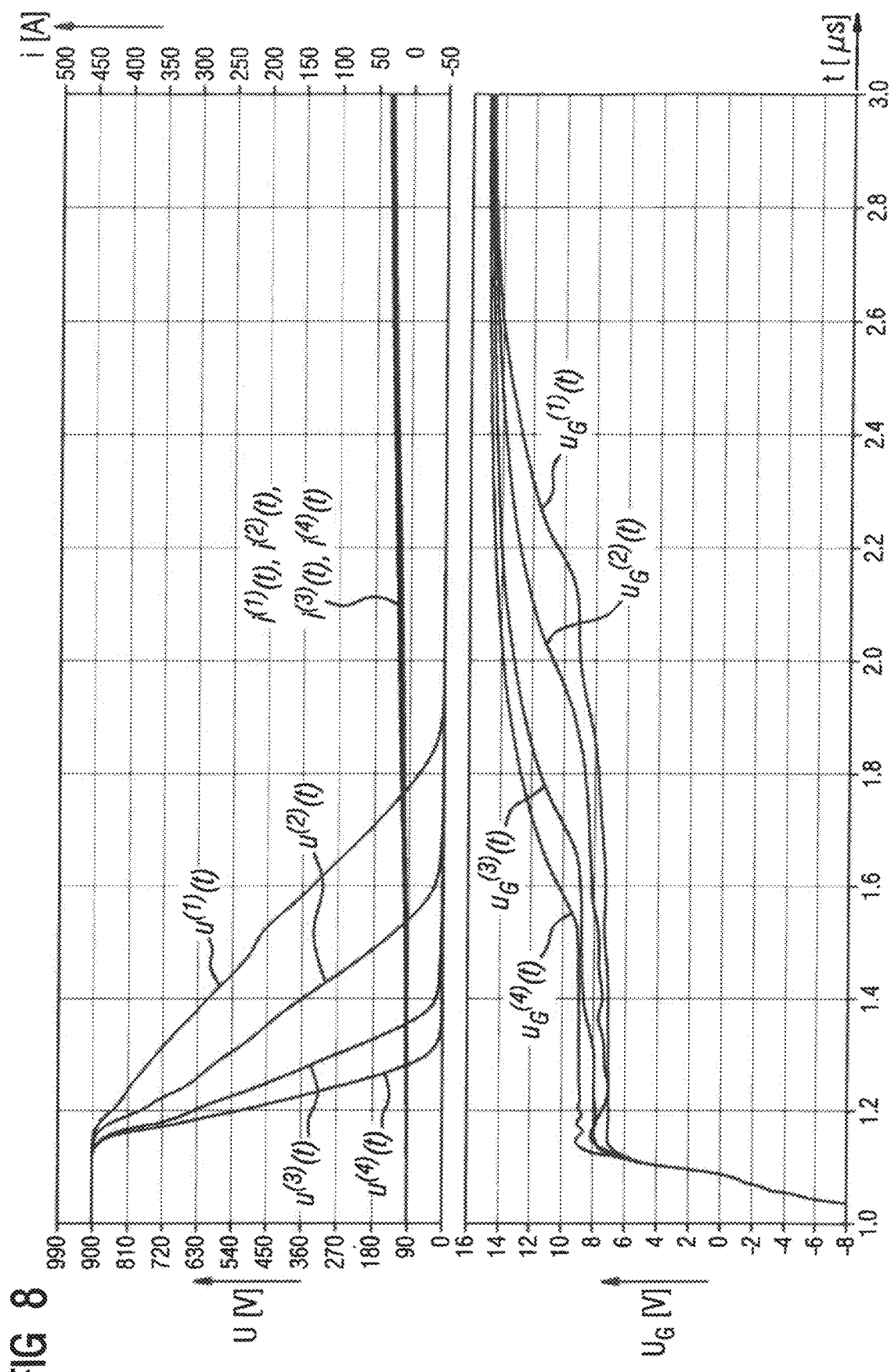
FIGS. 8 to 11 show simulation results for the simulated progression over time of the collector voltage, the collector current and the control voltage/gate voltage of a simulated switching transistor for different predetermined highest rates of rise of the voltage by means of an adjustable voltage source.

FIG. 8 shows simulation progressions u$^{(k)}$(t),u$_G^{(k)}$(t),i$^{(k)}$(t),k=1 . . . 4 for the simulation of switch-on processes of the almost current-free switching transistor T$_2$. The higher the voltage of the adjustable voltage source U$_{adapt}$ is selected to be, that is, with increasing index k, the higher is the rate of rise of the voltage $$\frac{du}{dt}$$

of the collector voltage progression u$^{(k)}$(t),k=1 . . . 4. The plateau of the gate voltage progressions u$_G^{(k)}$(t),k=1 . . . 4 differs accordingly. With this embodiment, the rate of rise of the voltage $$\frac{du}{dt}$$

of the collector voltage progression u$^{(k)}$(t),k=1 . . . 4 can be reduced to a quarter of the value that is achievable without the control circuits RS1, RS2.

Figure 9:
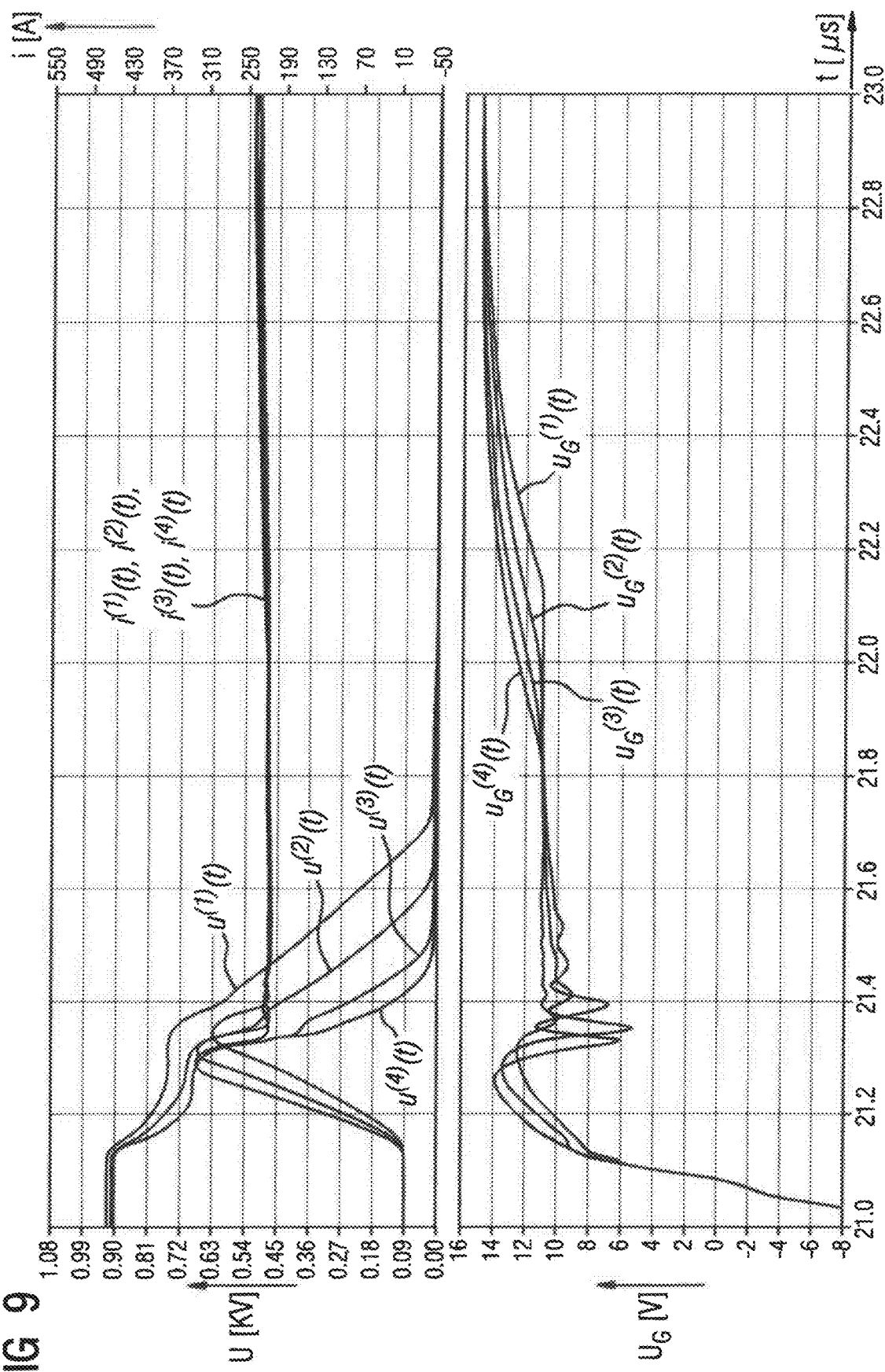

FIG. 9 shows simulation progressions u$^{(k)}$(t),u$_G^{(k)}$(t),i$^{(k)}$(t),k=1 . . . 4 for the simulation of switch-on processes of the switching transistor T$_2$ with half the nominal current strength, i.e. at a switched current strength of 200 ampere.

Figure 10:
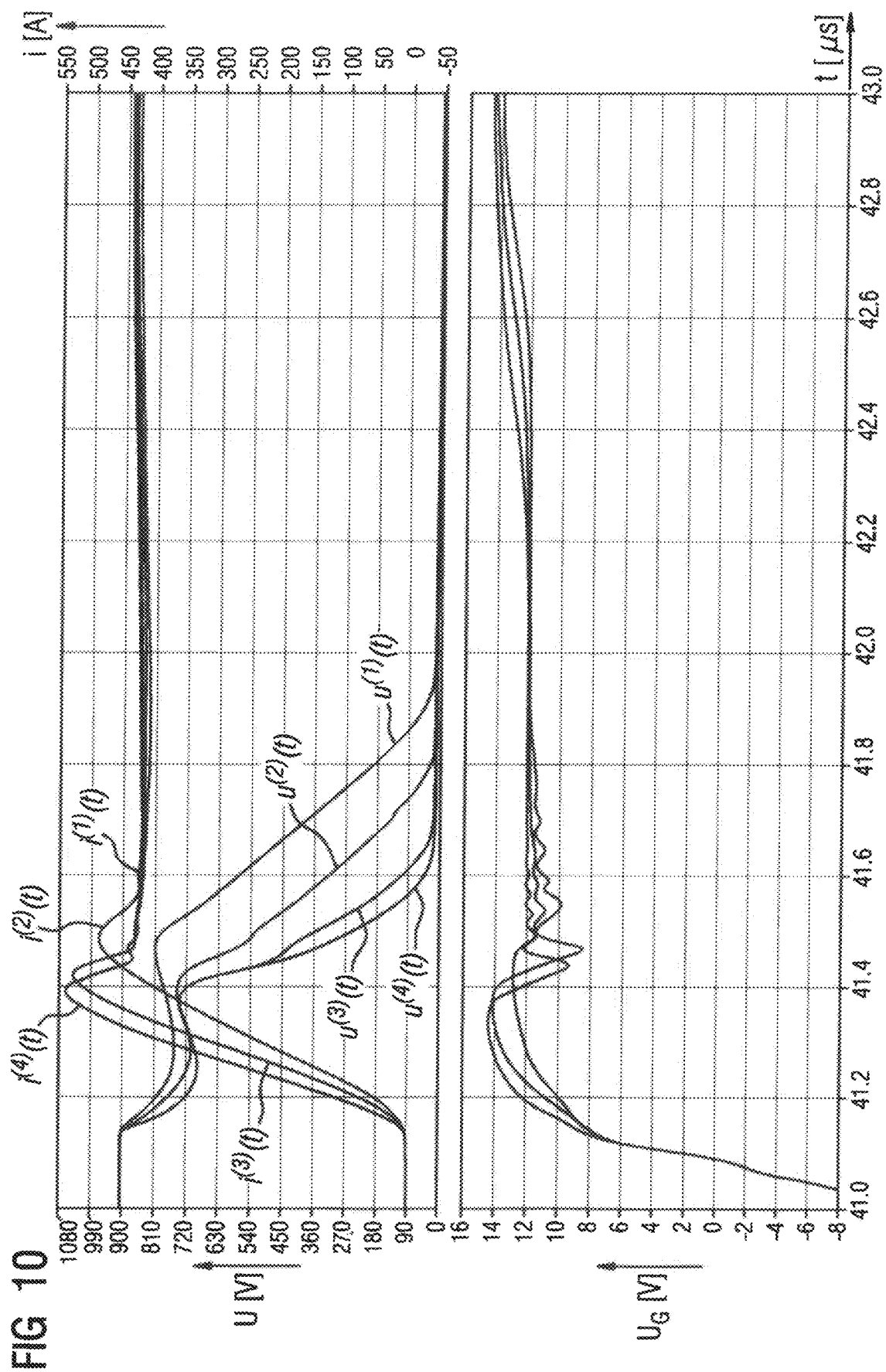

FIG. 10 shows simulation progressions u$^{(k)}$(t),u$_G^{(k)}$(t),i$^{(k)}$(t),k=1 . . . 4 for the simulation of switch-on processes of the switching transistor T$_2$ at the nominal current strength, i.e. at a switched current strength of 400 ampere.

It can be seen from FIGS. 9 and 10 that the rate of rise of the voltage $$\frac{du}{dt}$$

decreases with increasing switched current strength. At the same time, the influence of the voltage of the adjustable voltage source U$_{adapt}$ decreases, in particular, at lower voltage values so that the rate of rise $$\frac{du}{dt}$$

of the collector voltage progressions u$^{(k)}$(t),k=1 . . . 4 differs less strongly at higher switched current strengths than at lower switched current strengths.

Figure 11:
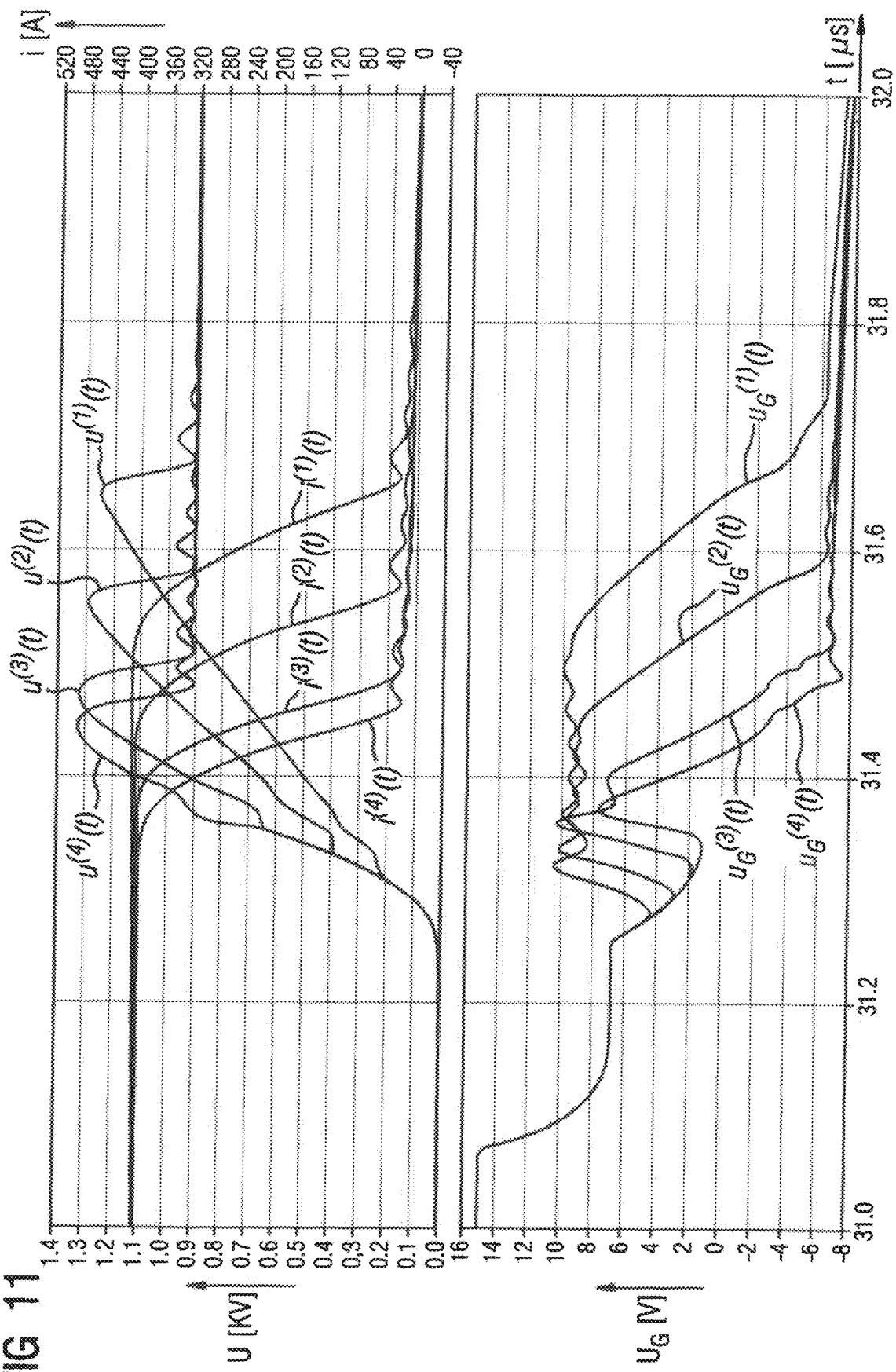

FIG. 11 shows simulation progressions u$^{(k)}$(t),u$_G^{(k)}$(t),i$^{(k)}$(t),k=1 . . . 4 for the simulation of switch-off processes of the switching transistor T$_2$ at the nominal current strength, i.e. at a switched current strength of 400 ampere. Here also, with increasing voltage of the adjustable voltage source U$_{adapt}$ the rate of rise of the voltage $$\frac{du}{dt}$$

rises to follow the value. In addition, a different plateau height is reached in the gate voltage progressions u$_G^{(k)}$(t), k=1 . . . 4 as the collector voltage u increases.

Although the invention has been illustrated and described in detail on the basis of exemplary embodiments, the invention is not restricted by the examples given and other variations can readily be derived therefrom by a person skilled in the art, without departing from the protective scope of the invention.

What is claimed is:

1. A semiconductor switch device, comprising:

a power semiconductor having a collector or a drain, an emitter or a source, and a control electrode embodied as a gate or a gate electrode, and configured to be switchable along a collector-emitter path or a drain-source path via the control electrode, at least one control circuit comprising a current sink capacitively coupled to the collector via a regulating capacitor configured to divert, up to an adjustable maximum current, a partial current of a total current flowing via the regulating capacitor during a switching process, wherein the adjustable maximum current is adjustable via an adjustable current source, and a current amplifier having an input side connected to an end of the current sink that is capacitively coupled to the regulating capacitor and to a positive or a negative supply voltage, and an output side connected to the control electrode of the power semiconductor, with the current amplifier configured to amplify by a predetermined amplification factor the partial current flowing via the regulating capacitor and not being diverted by the current sink during the switching process and to apply the amplified partial current to the control electrode so as to counteract a change in a voltage across the collector-emitter path or across the drain-source path during the switching process, and the semiconductor switch device further comprising an additional circuit connected to the control electrode and configured to provide a smooth switch-on transition of a collector voltage or a drain voltage, or both, when switching over the collector-emitter path or drain-source path from a blocked state to a conductive state.

2. The semiconductor switch device of claim 1, wherein a first control circuit of the at least one control circuit comprises a first current amplifier connected to a negative supply voltage and configured to supply a negative current to the control electrode, and a second control circuit of the at least one control circuit comprises a second current amplifier connected to a positive supply voltage and configured to supply a positive current to the control electrode.

3. The semiconductor switch device of claim 1, wherein the current sink comprises a metal oxide semiconductor field effect transistor (MOSFET) connected in a current feedback arrangement, a current feedback resistor and the adjustable voltage source, wherein a drain electrode of the MOSFET is connected to the regulating capacitor and a source electrode of the MOSFET is connected via the current feedback resistor to ground and a gate electrode of the MOSFET is supplied by the adjustable voltage source with a voltage referenced against ground.

4. The semiconductor switch device of claim 1, wherein the current amplifier comprises a follower semiconductor connected as a source/emitter follower, a gate resistor, a source resistor and a diode, wherein the diode is disposed between the regulating capacitor and a control electrode of the follower semiconductor in a forward-conducting direction toward the control electrode, wherein the gate resistor is disposed between the control electrode of the follower semiconductor and the control electrode of the power semiconductor, and wherein the source resistor is disposed between a source electrode of the follower semiconductor and the control electrode of the power semiconductor.

5. The semiconductor switch device of claim 4, wherein the follower semiconductor is configured as a MOSFET connected as a source-follower.

6. The semiconductor switch device of claim 4, wherein the follower semiconductor is configured as a bipolar transistor connected as an emitter follower.

7. The semiconductor switch device of claim 1, wherein the power semiconductor is configured as an insulated-gate bipolar transistor (IGBT), as a metal oxide semiconductor field-effect transistor (MOSFET), as a silicon carbide metal oxide semiconductor field-effect transistor (SiC MOSFET) or as a bipolar transistor.

8. A frequency converter comprising a semiconductor switch device according to claim 1, wherein the power semiconductor is constructed as an insulated-gate bipolar transistor (IGBT).

* * * * *